(12) United States Patent
Ando et al.

(10) Patent No.: US 8,637,930 B2
(45) Date of Patent: Jan. 28, 2014

(54) FINFET PARASITIC CAPACITANCE REDUCTION USING AIR GAP

(75) Inventors: Takashi Ando, Tuckahoe, NY (US); Josephine B. Chang, Mahopac, NY (US); Sivananda K. Kanakasabapathy, Niskayuna, NY (US); Pranita Kulkarni, Slingerlands, NY (US); Theodorus E. Standaert, Clifton Park, NY (US); Tenko Yamashita, Schenectady, NY (US)

(73) Assignee: International Business Machines Company, Armonk, NY (US)

( * ) Notice: Subject to any disclaimer, the term of this patent is extended or adjusted under 35 U.S.C. 154(b) by 104 days.

(21) Appl. No.: 13/272,409

(22) Filed: Oct. 13, 2011

(65) Prior Publication Data

US 2013/0093019 A1     Apr. 18, 2013

(51) Int. Cl.
*H01L 29/78*     (2006.01)
*H01L 21/336*    (2006.01)

(52) U.S. Cl.
USPC .................... 257/347; 438/151; 257/E21.409

(58) Field of Classification Search
USPC ................. 257/386, 401, 347, 410, E21.409, 257/E21.19, E21.581, E21.573; 438/479, 438/299, 585
See application file for complete search history.

(56) References Cited

U.S. PATENT DOCUMENTS

| | | | | |
|---|---|---|---|---|
| 6,051,861 A * | 4/2000 | Togo | | 257/340 |
| 6,693,335 B2 * | 2/2004 | Gonzalez et al. | | 257/410 |
| 6,833,588 B2 * | 12/2004 | Yu et al. | | 257/347 |
| 7,132,342 B1 * | 11/2006 | Sadovnikov et al. | | 438/303 |
| 7,838,373 B2 * | 11/2010 | Giles et al. | | 438/303 |
| 2001/0045608 A1 | 11/2001 | Tseng et al. | | |
| 2004/0232496 A1 * | 11/2004 | Chen et al. | | 257/390 |
| 2004/0262698 A1 * | 12/2004 | Nowak | | 257/401 |
| 2005/0242406 A1 * | 11/2005 | Hareland et al. | | 257/401 |
| 2005/0253203 A1 | 11/2005 | Liaw | | |
| 2007/0222036 A1 * | 9/2007 | Park et al. | | 257/619 |

(Continued)

FOREIGN PATENT DOCUMENTS

| | | |
|---|---|---|
| EP | 1837906 A2 | 9/2007 |
| EP | 1923908 A2 | 5/2008 |
| WO | 2005001905 A2 | 1/2005 |
| WO | 2012159314 A1 | 11/2012 |

OTHER PUBLICATIONS

Manoj et al., "Impact of Fringe Capacitance on the Performance of Nanoscale FinFETs", IEEE Electron Device Letters, vol. 31, No. 1 Jan. 2010.
Wang et al., "Simulation Study of Multiple FIN FinFET Design for 32nm Technology Node and Beyond", Simulation of Semiconductor Processes and Devices, vol. 12, Sep. 2007, pp. 125-128.

(Continued)

*Primary Examiner* — Long K Tran
*Assistant Examiner* — Jordan Klein
(74) *Attorney, Agent, or Firm* — Harrington & Smith

(57) ABSTRACT

A transistor, for example a FinFET, includes a gate structure disposed over a substrate. The gate structure has a width and also a length and a height defining two opposing sidewalls of the gate structure. The transistor further includes at least one electrically conductive channel between a source region and a drain region that passes through the sidewalls of the gate structure; a dielectric layer disposed over the gate structure and portions of the electrically conductive channel that are external to the gate structure; and an air gap underlying the dielectric layer. The air gap is disposed adjacent to the sidewalls of the gate structure and functions to reduce parasitic capacitance of the transistor. At least one method to fabricate the transistor is also disclosed.

14 Claims, 4 Drawing Sheets

(56) References Cited

U.S. PATENT DOCUMENTS

| | | | |
|---|---|---|---|
| 2007/0284648 A1* | 12/2007 | Park et al. | 257/316 |
| 2008/0111199 A1* | 5/2008 | Kim et al. | 257/401 |
| 2009/0253255 A1 | 10/2009 | Kim et al. | |
| 2010/0258870 A1* | 10/2010 | Hsu et al. | 257/347 |
| 2011/0049583 A1 | 3/2011 | Lin et al. | |
| 2011/0065244 A1 | 3/2011 | Chang et al. | |
| 2011/0084340 A1 | 4/2011 | Yuan et al. | |
| 2012/0302014 A1 | 11/2012 | Huang et al. | |

OTHER PUBLICATIONS

Grogg et al, "Nano-Electro-Mechanical Vibrating Body FET Resonator for High Frequency Integrated Oscillators", Device Research Conference (DRC) Jun. 2010.

German Search Report for Application No. 102012217491.5 dated May 31, 2013 (No translation available).

Combined Search and Examination Report under Sections 17 and 18(3) for corresponding GB Patent Appplication No. 1217771.3 mailed Jan. 13, 2013.

\* cited by examiner

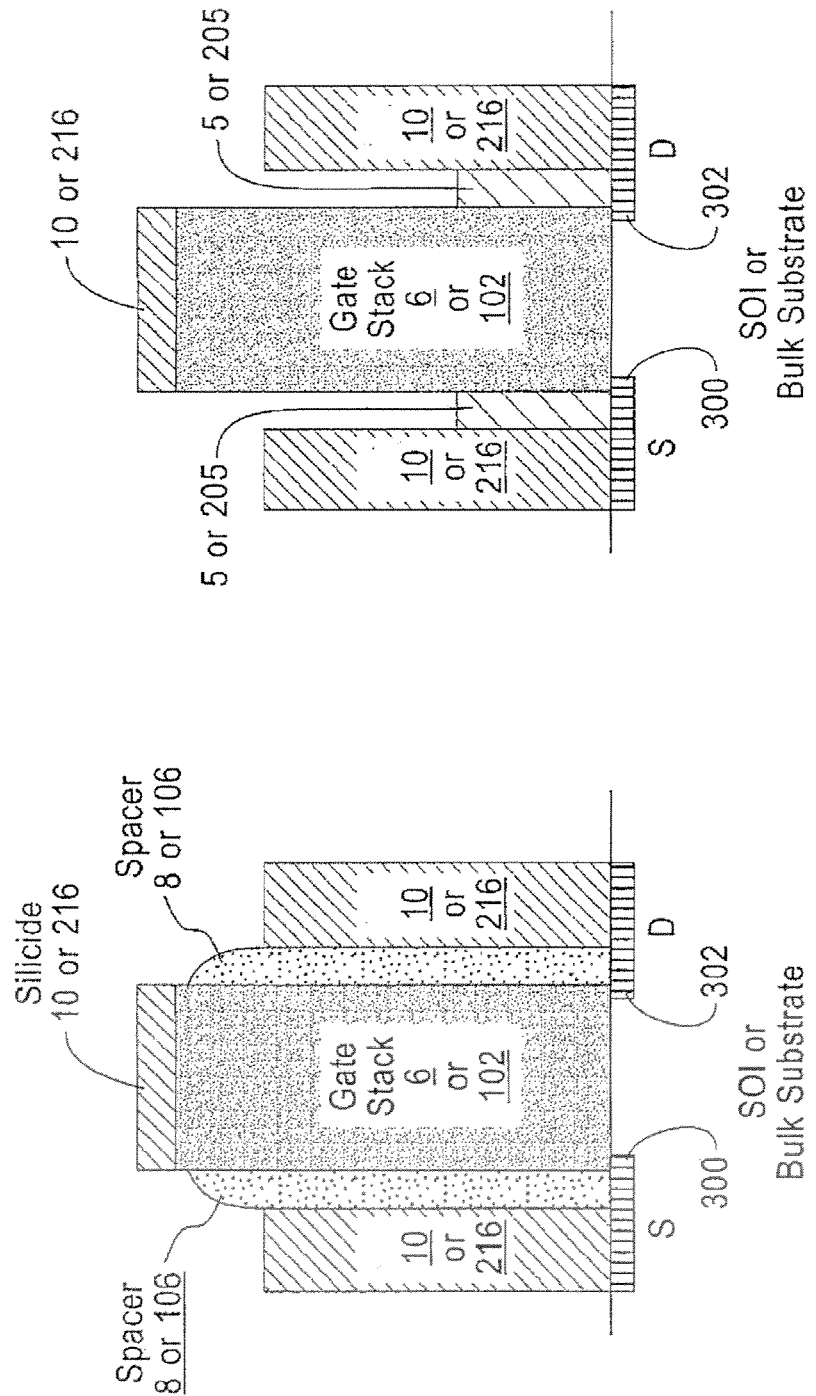

FINFET PARASITIC CAPACITANCE REDUCTION USING AIR GAP

TECHNICAL FIELD

The exemplary embodiments of this invention relate generally to field effect transistors (FETs) and, more specifically, relate to multi-gate FETs such as FinFETs and to techniques for reducing parasitic capacitance.

BACKGROUND

Basically a FET is a transistor having a source, a gate, and a drain. The action of the FET depends on the flow of majority carriers along a channel between the source and drain that runs past the gate. Current through the channel, which is between the source and drain, is controlled by the transverse electric field under the gate. More than one gate (multi-gate) can be used to more effectively control the channel. The length of the gate determines how fast the FET switches, and can be about the same as the length of the channel (i.e., the distance between the source and drain).

The size of FETs has been successfully reduced through the use of one or more fin-shaped channels. A FET employing such a channel structure can be referred to as a FinFET. Previously, complementary metal-oxide semiconductor (CMOS) devices were substantially planar along the surface of the semiconductor substrate, the exception being the FET gate that was disposed over the top of the channel. Fins break from this paradigm by using a vertical channel structure in order to maximize the surface area of the channel that is exposed to the gate. The gate controls the channel more strongly because it extends over more than one side (surface) of the channel. For example, the gate can enclose three surfaces of the three-dimensional channel, rather than being disposed only across the top surface of the traditional planar channel. In some devices the gate can completely enclose the channel, i.e., a suspended channel passes through the gate and all surfaces of the channel are exposed to the gate.

One challenge in fabricating multi-gate FETs is the inherently high parasitic capacitance as compared to conventional planar FETs. For example, reference can be made to "Simulation Study of Multiple FIN FinFET Device Design for 32 nm Technology Node and Beyond"; X. Wang et al., Simulation of Semiconductor Process and Device, Vol. 12, pages. 125-128, and to "Impact of Fringe Capacitance on Performance of Nanoscale FinFETs", C. R. Manoj et al., IEEE Electron Device Letters, Vol. 31, p. 83-85.

SUMMARY

In one aspect the exemplary embodiments of this invention provide a transistor that comprises a gate structure disposed over a substrate. The gate structure has a width and also a length and a height defining two opposing sidewalls of the gate structure. The transistor further comprises at least one electrically conductive channel between a source region and a drain region that passes through the sidewalls of the gate structure; a dielectric layer disposed over the gate structure and portions of the electrically conductive channel that are external to the gate structure; and an air gap underlying the dielectric layer. The air gap is disposed adjacent to the sidewalls of the gate structure.

In another aspect the exemplary embodiments of this invention provide a method to fabricate a transistor. The method comprises forming over a substrate at least one electrically conductive channel between a source region and a drain region and forming a gate structure to be disposed over a portion of the at least one electrically conductive channel. The gate structure has a width and a length and a height defining two opposing sidewalls of the gate structure. The gate structure is formed such that the at least one electrically conductive channel the passes through the sidewalls of the gate structure. The method further comprises forming spacers on the sidewalls of the gate structure; forming a layer of epitaxial silicon over the at least one electrically conductive channel; removing the spacers; and forming a dielectric layer to be disposed over the gate structure and portions of the electrically conductive channel that are external to the gate structure such that an air gap underlies the dielectric layer. The air gap is disposed adjacent to the sidewalls of the gate structure in a region formerly occupied by the spacers.

In a further aspect the exemplary embodiments of this invention provide a method to reduce parasitic capacitance in a multi-gate field effect transistor. The method comprises fabricating a plurality of fins between a source region and a drain region; fabricating a gate structure such that the plurality of fins pass through sidewalls of the gate structure; and encapsulating at least a portion of the multi-gate field effect transistor in a layer of dielectric material such that an air gap is formed adjacent to the sidewalls of the gate structure and beneath the layer of dielectric material.

BRIEF DESCRIPTION OF THE SEVERAL VIEWS OF THE DRAWINGS

FIG. 1A shows the definition of polysilicon (Poly Si) mandrel on a $SiO_2$ layer formed on a silicon-on-insulator (SOI) layer;

FIG. 1B shows a result of SIT pitch doubling, where sidewalls of the mandrel have SiN layers formed thereon;

FIG. 1C shows a result of an etching operation and mandrel removal, and the resultant fins (the underlying BOX (buried oxide) and substrate of the SOI wafer are not shown);

FIG. 1D depicts a result of gate stack deposition and planarization, hard mask deposition, gate lithography and a reactive ion etch;

FIG. 1E shows a result of SiN offset spacer formation followed by an extension implant;

FIG. 1F shows a result of epitaxial Silicon growth that provides a layer of epi Si that covers the fins; and FIG. 1G shows a result of offset spacer removal and final spacer formation followed by S/D implant and a rapid thermal anneal FIGS. 2A-2H, collectively referred to as FIG. 2, illustrate another exemplary method to fabricate a FinFET device, where

FIG. 3A shows a cross-sectional view of the FinFET device formed by either the exemplary process of FIG. 1 or the exemplary process of FIG. 2.

FIG. 3B shows a result of further processing in accordance with the embodiments of this invention, where SiN spacers adjacent to sidewalls of the gate structure are removed.

DETAILED DESCRIPTION

The exemplary embodiments of this invention are described below in the context of a FinFET. FIGS. 1A-1G provide an overview of one exemplary technique to fabricate a FinFET in accordance with an embodiment shown in commonly assigned US Patent Application Publication US 2011/0049583 A1, "Recessed Contact for Multi-Gate FET Optimizing Series Resistance", Chung-Hsun Lin and Josephine B. Chang. FIGS. 2A-2H provide an overview of another exemplary technique to fabricate a FinFET in accordance with an embodiment shown in commonly assigned US Patent Application Publication US 2011/0065244 A1, "Asymmetric FINFET Device with Improved Parasitic Resistance and Capacitance", Josephine B. Chang, Leland Chang, Chung-Hsun Lin and Jeffery W. Sleight.

FIGS. 1A-1G are presented in the exemplary context of side wall image transfer (SIT) fabrication technique that uses a spacer as a hard mask to define the fin. However, this is but one suitable FinFET fabrication technique, and should not be construed in a limiting sense upon the use and practice of this invention. In general, the exemplary embodiments of this invention can be used with or without a hard mask. Also, the exemplary embodiments may use a silicon-on-insulator (SOI) substrate or they may use a bulk substrate.

Figure 1A:
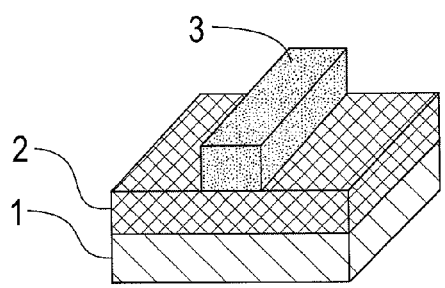
FIGS. 1A-1G, collectively referred to as FIG. 1, illustrate an overview of one exemplary procedure (side wall image transfer) to fabricate a FinFET device; where
Figure 1D:
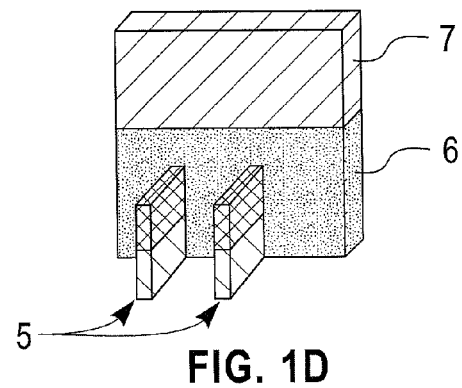
Figure 1B:
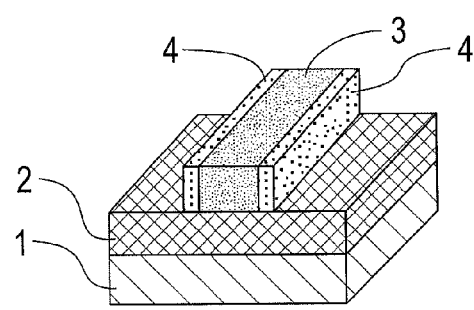
Figure 1E:
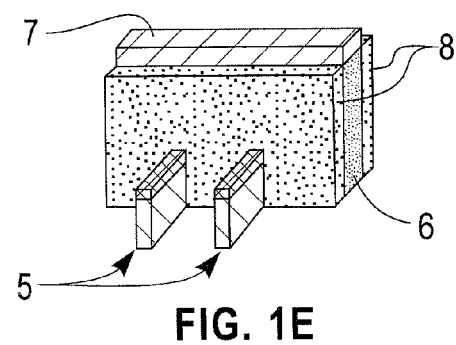
Figure 1C:
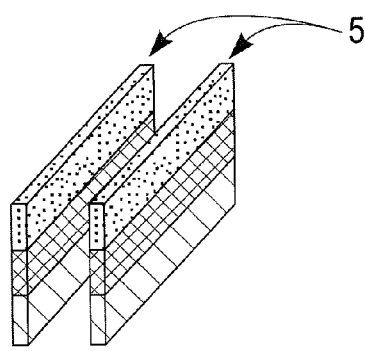
Figure 1F:
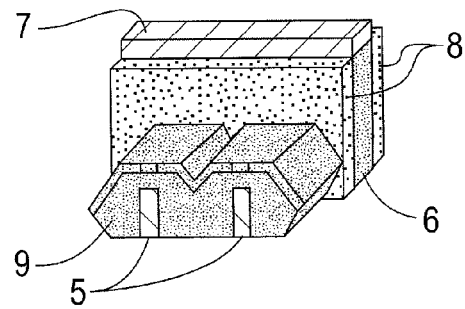
Figure 1G:
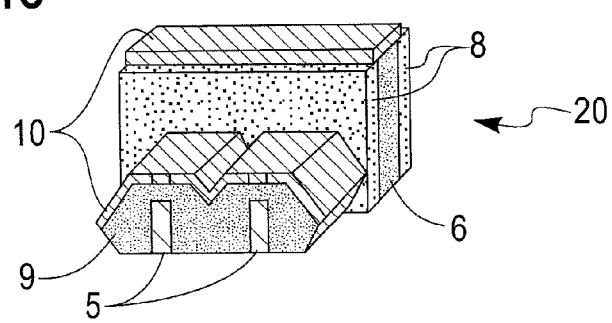

FIG. 1A shows the definition of polysilicon (Poly Si) mandrel 3 on a SiO$_2$ layer 2 formed on a silicon-on-insulator (SOI) layer 1 (the underlying buried oxide (BOX) and substrate of the SOI wafer are not shown). FIG. 1B shows a result of SIT pitch doubling, where sidewalls of the mandrel 3 have SiN layers 4 formed thereon. FIG. 1C shows a result of an etching operation and mandrel removal, and the resultant fins 5 (the underlying BOX (buried) and substrate of the SOI wafer are not shown). Each fin 5 is a multi-layered structure composed of a Si lower layer (which forms the channel of the completed FinFET), a SiO$_2$ middle layer and a SiN upper layer (which is removed prior to performing the operations shown in FIG. 1D). FIG. 1D depicts a result of gate stack deposition and planarization, hard mask deposition, gate lithography and a reactive ion etch (RIE). The resulting gate stack 6 includes, by example, a poly Si gate and an overlying layer of SiN 7. FIG. 1E shows a result of SiN offset spacer 8 formation followed by an extension implant. FIG. 1F shows a result of epitaxial Silicon (epi Si) growth that provides a layer 9 of epi Si that covers the fins 5 thereby merging the fins. FIG. 1G shows a result of offset spacer removal and final spacer formation followed by S/D implant and a rapid thermal anneal (RTA). The resulting FinFET device 20 includes a layer 10 of silicide over the top of the gate stack 6 and over the fin epi Si. In general, the FIGS. 1D-1G show the exposed fins 5 of FIG. 1C being transformed to a S/D. The silicide layer 10 can have a thickness in a range of about 5 nm to about 30 nm (or thicker). In some embodiments the silicide layer 10 can have a nominal thickness of about 10 nm. The silicide layer 10 can be comprised of any suitable silicide, such as cobalt silicide (CoSi$_2$), nickel silicide (NiSi), or platinum silicide (PtSi, Pt$_2$Si), as non-limiting examples.

Figure 2A:
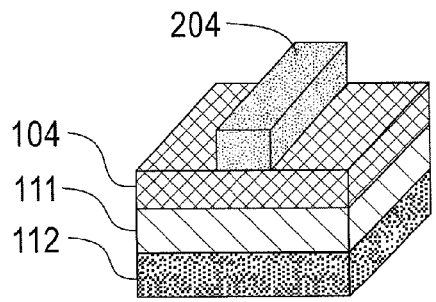
FIG. 2A shows a hardmask layer formed on a substrate and a polysilicon structure.
Figure 2B:
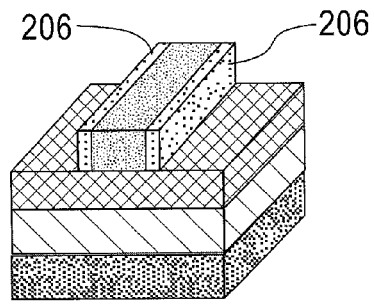
FIG. 2B shows silicon nitride (SiN) structures are formed along the sides of the polysilicon structure.
Figure 2C:
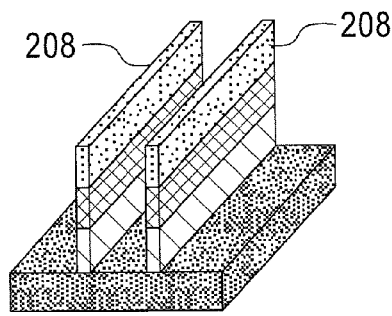
FIG. 2C shows a result of etching to form fin structures.
Figure 2D:
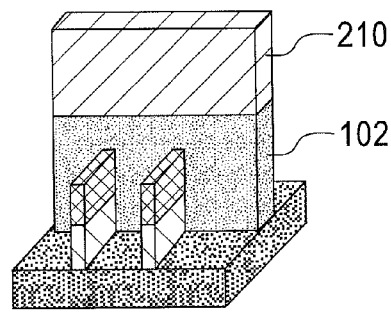
FIG. 2D shows a result of additional etching and gate stack and SiN layer formation perpendicular to the fin structures.
Figure 2E:
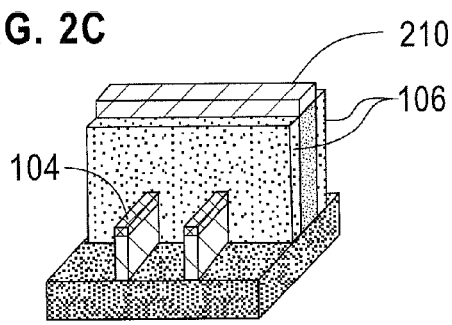
FIG. 2E shows a result of removal of portions of the hardmask layer and the SiN layer, and formation of SiN spacers along the gate stack.
Figure 2F:
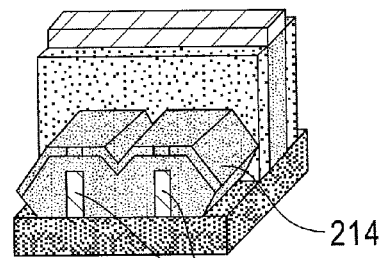
FIG. 2F shows an epitaxial silicon (Epi Si) layer deposited over the fin structures.
Figure 2G:
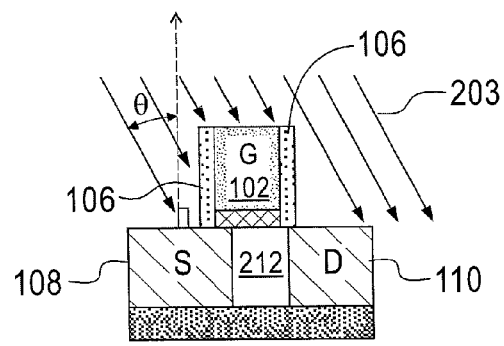
FIG. 2G illustrates a cross sectional view of an angled ion implant procedure that forms source and drain regions.
Figure 2H:
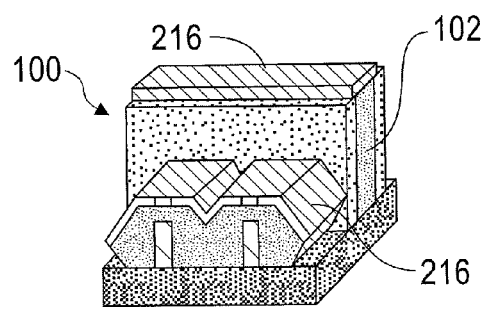
FIG. 2H shows a silicide layer formed on the Epi Si layer and over the gate stack.

FIGS. 2A-2H illustrate another exemplary method for fabricating a FinFET device 100. Referring to FIG. 2A, a silicon dioxide (SiO$_2$) (or Silicon Nitride (SiN)) hardmask layer 104 is formed on a substrate. In the illustrated embodiment the substrate can be a silicon-on-insulator (SOI) layer 111. In other embodiments the substrate can be a bulk substrate. A polysilicon structure 204 is formed on the hardmask layer 104 by deposition and etching processes. Referring to FIG. 2B, silicon nitride (SiN) structures 206 are formed along the sides of the polysilicon structure 204 using deposition and etching processes. In FIG. 2C, the polysilicon structure 204 and portions of the hardmask layer 104 and the SOI layer 111 are etched to form fin structures 208. The illustrated two fin structures 208 are exemplary, as more or less than two fin structures can be formed. In FIG. 2D, the SiN structures 206 are etched, and a gate stack portion 102 and a SiN layer 210 is formed perpendicular to the fin structures 208. Referring to FIG. 2E, portions of the hardmask layer 104 and the SiN layer 210 are removed, and SiN spacers 106 are formed along the gate stack portion 102. In FIG. 2F an epitaxial silicon (Epi Si) layer 214 is deposited over the remaining fin structures 205 for merging the fin structures. FIG. 2G illustrates a cross sectional view an ion implant that forms the source 108 and drain 110 regions in the SOI layer 111. In the illustrated non-limiting embodiment the ions 203 are implanted at an angle (theta) from a line perpendicular to the source region 108. The gate stack portion 102 and the spacers 106 partially block some of the ions 203 from being deposited at a great concentration in the portion 212 of the SOI layer 111, and the implant at the oblique angle (theta) results in an overlapped source region 108 and an offset drain region 110. The implant angle may range from 0-90 degrees, and any additional ranges between 0-90 degrees. An exemplary implant angle of 20-30 degrees is shown in the illustrated embodiments. Referring to FIG. 2H, a silicide layer 216, is formed on the Epi Si layer 214 and over the gate stack portion 102.

FIG. 3A shows a cross-sectional view of the FinFET device formed by either the exemplary process of FIG. 1 or the exemplary process of FIG. 2. The gate stack 6 or 102 is shown disposed between the SiN spacers 8 or 106, respectively. In practice when the SiN spacers 8 or 106 are formed they will exhibit a generally tapered upper profile, where the thickness gradually decreases towards the top of the spacer. Source (S) and drain (D) implants 300, 302 may be located in the underlying SOI or bulk substrate material.

FIG. 3B shows a result of further processing in accordance with embodiments of this invention, wherein the SiN spacers 8 or 106 are removed. This can be accomplished by a wet chemical etch process, such as by the use of hot phosphoric acid.

Figure 3C:
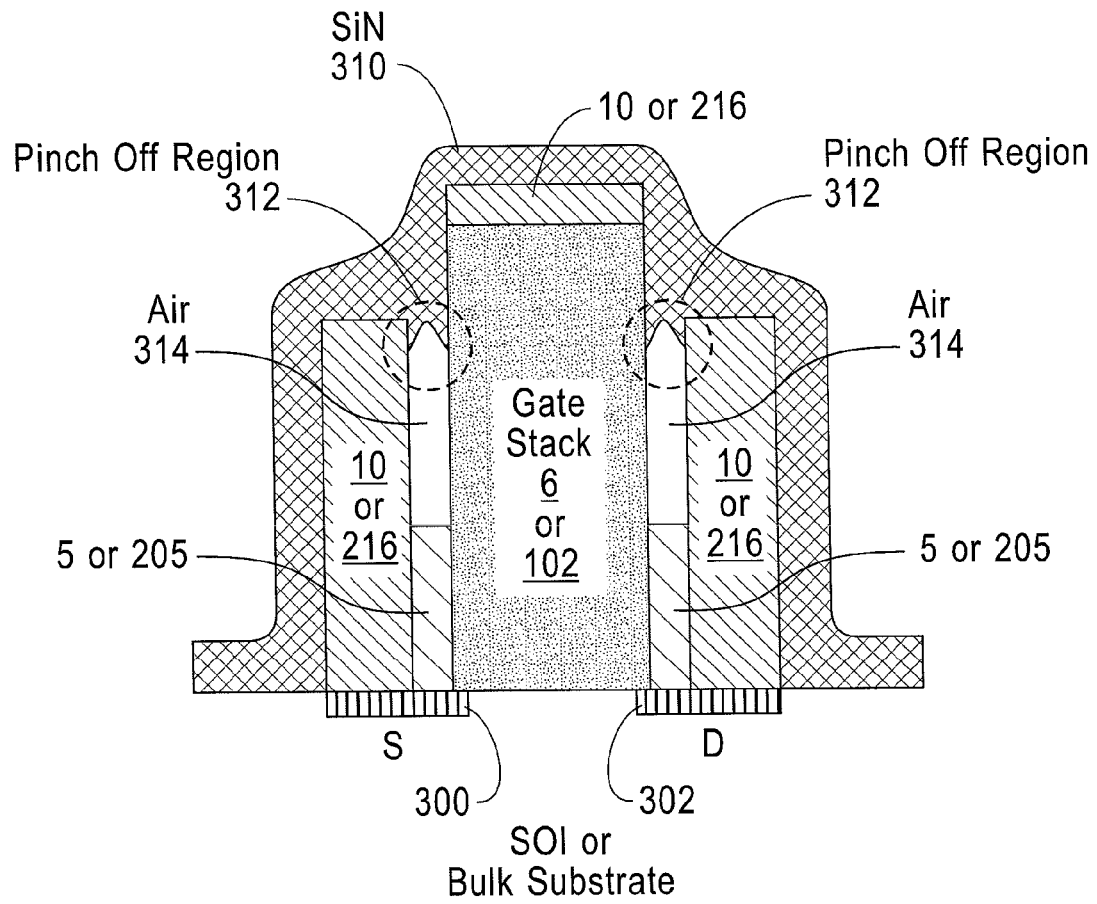
FIG. 3C shows a result of the deposition of an interlayer dielectric layer to substantially uniformly coat the structure of the FinFET and that forms, where the SiN spacers were removed in FIG. 3B, an underlying air gap disposed adjacent to sidewalls of the gate structure.

FIG. 3C shows a result of the deposition of an interlayer dielectric (ILD) layer, such as a SiN capping layer 310. As can be seen, the SiN capping layer 310 substantially uniformly coats the structure of the FinFET 20 or 100. However, and in accordance with embodiments of this invention, in the regions where the SiN spacers 8 or 106 were removed in FIG. 3B a pinch-off region 312 is formed near to the top leaving an underlying air gap 314 disposed adjacent to sidewalls of the gate stack 6 or 102. The air gap 314 is substantially continuous along the sidewalls of the gate stack except for where the fin 5 or 205 extends from the silicided portions 10 or 216 into the gate stack 6 or 102.

In a non-limiting embodiment the thickness of the original SiN spacers 8 or 106 can be in a range of about 5 nm to about 10 nm, which then becomes the approximate width of the air gap 314. The SiN capping layer can be deposited using a relatively low temperature (e.g., approximately 350° C.) plasma-enhanced chemical vapor deposition (PECVD) process. $Si_3N_4$ using the low temperature (~350° C.) PECVD process is a non-limiting example of one suitable process to form the capping layer to create the airgap 314.

The dielectric constant of air is about unity as compared to the dielectric constant of SiN which is about 7-7.5. The resulting spacer formed by the air gap 314 thus provides enhanced electrical performance by reducing parasitic capacitance between the gate and the source/drains, i.e., between the gate stack 6 or 102 and the fins 5 or 205 of the exemplary FinFET embodiments 20 or 100 of FIGS. 1 and 2, respectively.

In general, the FinFET 20 or 100 in accordance with the exemplary embodiments of this invention can be implemented as an N-type device or a P-type device. The gate stacks can be fabricated using poly Si or metal, any suitable gate dielectric material can be used, and the silicide layers can be composed of any suitable type of silicide. The FinFETs 20 or 100 can be constructed to have single fin or channel structure passing through the width of the gate stack, or there can be two or more fins or channel structures passing through the width of the gate stack. Clearly, the exemplary embodiments of this invention apply to multi-gate transistors. In addition, it should be appreciated that the exemplary embodiments of this invention also apply to wire-type transistors, wherein the channel structure passes through the width of the gate stack such that all surfaces of the channel structure (i.e., top surface, two side surfaces, and the bottom surface) are adjacent to or surrounded by the gate stack and can be electrically influenced by the gate stack. In this embodiment there can be any number of wire-type channel structures passing through the width of the gate stack. It should be appreciated that the FinFET 20 or 100, or more generally the transistors 20 or 100, are not to be construed as being limited to or by only the exemplary geometries, materials, dielectric films, fabrication processes, dimensions and/or layer thicknesses mentioned above.

As such, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

What is claimed is:

1. A transistor, comprising:
a gate structure disposed over a substrate, said gate structure having a width and also a length and a height defining two opposing sidewalls of said gate structure;
at least one electrically conductive channel between a source region and a drain region that passes through said sidewalls of said gate structure;
a dielectric layer disposed over said gate structure and portions of said electrically conductive channel that are external to said gate structure; and
an air gap underlying said dielectric layer, said air gap being disposed adjacent to said sidewalls of said gate structure and between the sidewalls of said gate structure and opposing sidewall surfaces of a layer of silicide that is disposed upon said at least one electrically conductive channel external to said gate structure.

2. The transistor of claim 1, where said air gap has a width of about 5 nm to about 10 nm.

3. The transistor of claim 2, where said air gap is substantially continuous from a bottom portion of said air gap adjacent to said substrate up to a pinch-off region defined by an underlying surface of said dielectric layer that bridges a top portion of said air gap.

4. The transistor of claim 1, where said dielectric layer is comprised of SiN or $Si_3N_4$.

5. The transistor of claim 1, where less than all surfaces of said at least one electrically conductive channel are electrically influenced by said gate structure.

6. The transistor of claim 1, where all surfaces of said at least one electrically conductive channel are electrically influenced by said gate structure.

7. A structure, comprising:
a substrate; and
a plurality of transistors disposed over said substrate, where at least one of said plurality of transistors comprises a gate structure disposed over said substrate, said gate structure having a width and also a length and a height defining two opposing sidewalls of said gate structure;
at least one electrically conductive channel between a source region and a drain region that passes through said sidewalls of said gate structure;
a dielectric layer disposed over said gate structure and portions of said electrically conductive channel that are external to said gate structure; and
an air gap underlying said dielectric layer, said air gap being disposed adjacent to said sidewalls of said gate structure and between the sidewalls of said gate structure and opposing sidewall surfaces of a layer of silicide that is disposed upon said at least one electrically conductive channel external to said gate structure.

8. The structure of claim 7, where said air gap has a width of about 5 nm to about 10 nm.

9. The structure of claim 8, where said air gap is substantially continuous from a bottom portion of said air gap adjacent to said substrate up to a pinch-off region defined by an underlying surface of said dielectric layer that bridges a top portion of said air gap.

10. The structure of claim 7, where said dielectric layer is comprised of SiN or $Si_3N_4$.

11. The structure of claim 7, where less than all surfaces of said at least one electrically conductive channel are electrically influenced by said gate structure.

12. The structure of claim 7, where all surfaces of said at least one electrically conductive channel are electrically influenced by said gate structure.

13. The structure of claim 7, where said at least one transistor is a multi-gate transistor.

14. The structure of claim 7, where said at least one transistor is a FinFet.

* * * * *